United States Patent
Takita

(10) Patent No.: US 6,204,729 B1
(45) Date of Patent: Mar. 20, 2001

(54) H-BRIDGE POWER AMPLIFIER FOR A MOTOR

(75) Inventor: Mark K. Takita, Palo Alto, CA (US)

(73) Assignee: Nikon Research Corporation of America, Belmont, CA (US)

(*) Notice: Subject to any disclaimer, the term of this patent is extended or adjusted under 35 U.S.C. 154(b) by 0 days.

(21) Appl. No.: 08/994,795

(22) Filed: Dec. 19, 1997

(51) Int. Cl.[7] .................................................. H03F 3/217
(52) U.S. Cl. ........................................... 330/146; 330/251
(58) Field of Search .................................. 330/146, 149, 330/269, 251; 318/677, 681; 327/314, 321, 326

(56) References Cited

U.S. PATENT DOCUMENTS

| | | | |
|---|---|---|---|
| 3,525,883 | * 8/1970 | Iordanidis | 318/681 |
| 4,581,565 | 4/1986 | Van Pelt et al. | 318/294 |
| 4,851,753 | 7/1989 | Hamilton | 318/609 |
| 4,873,618 | 10/1989 | Fredrick et al. | 363/17 |
| 5,144,211 | 9/1992 | Daggett et al. | 318/568.11 |
| 5,552,683 | 9/1996 | Dargent | 318/287 |
| 5,596,446 | 1/1997 | Plesko | 359/214 |
| 6,072,362 | * 6/2000 | Lincoln | 330/251 X |

* cited by examiner

Primary Examiner—Steven J. Mottola
(74) Attorney, Agent, or Firm—Skjerven Morrill MacPherson LLP; Norman R. Klivans; Michael J. Halbert

(57) ABSTRACT

A highly linear, low-distortion H-bridge amplifier is described. The amplifier includes four interconnected power transistors connected to an inductive load. Each transistor has a precision voltage clamp connected between the source and drain to suppress ringing oscillations. Two or more of the transistors also include high-speed transient-voltage suppressers connected in parallel with their respective voltage clamps. These transient-voltage suppressers do not have the clamping accuracy of the voltage clamps, but respond much more quickly to suppress noise spikes. The amplifier therefore takes advantage of both the fast response time of the transient-voltage suppressers and the precise voltage-clamping characteristics of the voltage clamps.

16 Claims, 2 Drawing Sheets

H-BRIDGE POWER AMPLIFIER FOR A MOTOR

BACKGROUND

1. Field of the Invention

This invention relates to control systems and methods for controlling inductive loads. More particularly, the invention relates to a low-noise and highly linear output stage for pulse-width-modulation (PWM) amplifiers.

2. Description of Related Art

Switching servo amplifiers are commonly used to supply drive current to inductive loads, such as linear, voice-coil, and DC motors. Such amplifiers often employ a type of output stage commonly known as H-bridge amplifiers, or simply "H-bridges."

FIG. 1 depicts a conventional H-bridge 100. H-bridge 100 includes four transistors M1–M4 configured to drive an inductive load 110. Each transistor M1–M4 has a corresponding diode D1–D4 connected, in a reverse-current direction, from source to drain. Diodes D1–D2 are typically fabricated integrally with respective transistors M1–M4. The gate voltages of transistors M1–M4 are controlled by driver-amplifier circuits (not shown) of a conventional switching servo amplifier to alternate the direction of current flow through load 110. Turning transistors M1 and M4 on and M2 and M3 off causes current to flow in one direction; turning transistors M1 and M4 off and M2 and M3 on causes current to flow in the other direction. Alternating between transistor pairs causes each terminal of load 110 to alternate between ground potential and the voltage level on power terminal +HV. The transistors are not switched simultaneously: some small delay ensures that transistors M1 and M2 (and similarly M3 and M4) do not conduct at the same time.

Conventional H-bridges and their associated circuitry are well known. An explanation of their operation is therefore omitted for brevity. For further information explaining the operation of several conventional H-bridge configurations, see the following U.S. Patents, the contents of which are incorporated herein by this reference:

4,581,565 to Van Pelt, et al., issued Apr. 8, 1986;
4,851,753 to Hamilton, issued Jul. 25, 1989;
4,873,618 to Fredrick et al., issued Oct. 10, 1989;
5,552,683 to Dargent, issued Sep. 3, 1996; and
5,596,446 to Plesko, issued Jan. 21, 1997.

Conventional H-bridge circuits are too noisy and produce excessive distortion for some precision applications. One facet of this noise is a "ringing" of the voltage levels on load terminals for a time after one pair of transistors is switched on and the alternate pair is switched off.

FIG. 2 illustrates the ringing of an output voltage level on terminal 120 of conventional H-bridge 100. The first segment of the waveform (e.g., T0 to T1) represents the time during which transistors M3 and M2 are on, causing the voltage on terminal 120 to approach ground potential (e.g., zero volts).

Transistors M3 and M2 are switched off and transistors M1 and M4 switched on at time T1. Upon switching, the voltage on terminal 120 exceeds the supply voltage +HV for an instant due to the inductive "kick" of load 110 and associated leads. This noise spike is depicted as a spike 200. Then, after some ringing 210, the voltage on terminal 120 finally settles to the supply voltage +HV. H-bridge 100 also exhibits a noise spike 220 and ringing 230 at time T2 when transistors M3 and M2 are switched on and transistors M1 and M4 are switched off.

Diodes D1–D4 do much to limit the energy of spikes 200 and 220 and associated ringing 210 and 230. Nevertheless, there remains a level of noise that is unacceptable for certain high-performance applications. There is therefore a need for a low-noise, highly linear output stage for pulse-width-modulation amplifiers.

SUMMARY

The present invention is directed to a highly linear PWM amplifier that exhibits low harmonic distortion. The amplifier includes four switching devices (e.g., power transistors) interconnected with each other and with an inductive load in an H configuration. Each transistor has a precision voltage clamp connected between the source and drain to suppress ringing oscillations. Two or more of the transistors also include ultra-high-speed transient-voltage suppressers connected in parallel with their respective voltage clamps. These transient-voltage suppressers do not have the clamping accuracy of the voltage clamps, but respond much more quickly to suppress noise spikes. An amplifier in accordance with the present invention therefore takes advantage of both the fast response time of the transient-voltage suppressers and the precise voltage-clamping characteristics of the voltage clamps.

This summary does not purport to define the scope of the invention. The scope of the invention is defined instead by the claims.

BRIEF DESCRIPTION OF THE FIGURES

The above and other features, aspects, and advantages of the present invention will become better understood with regard to the following description, appended claims, and accompanying figures, where:

DETAILED DESCRIPTION

Figure 3:
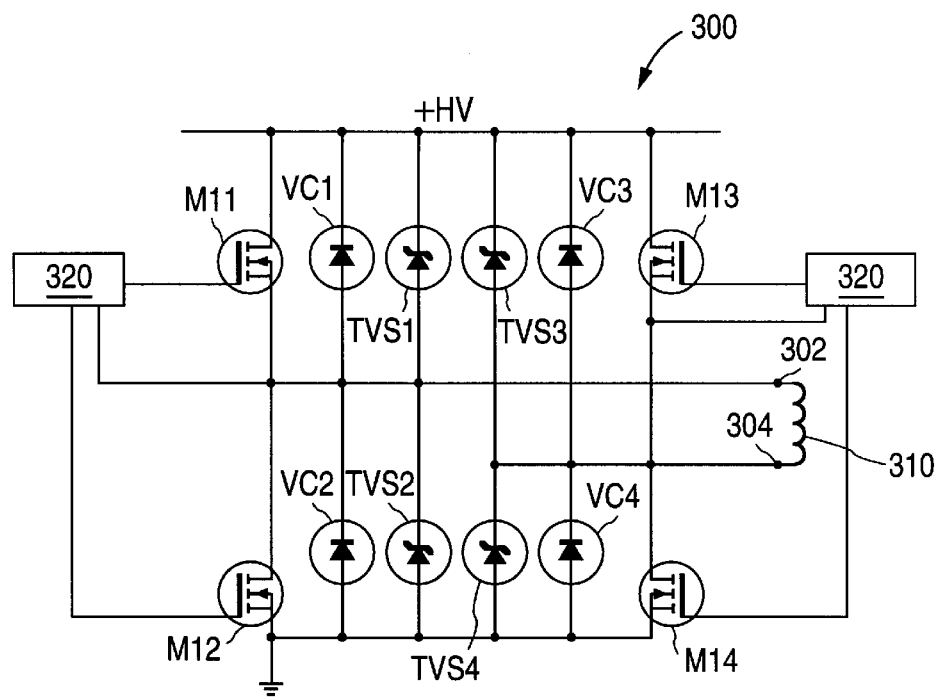
FIG. 3 depicts an H-bridge circuit 300 in accordance with the present invention.

FIG. 3 depicts an H-bridge circuit 300 in accordance with an embodiment of the present invention. H-bridge 300 includes four MOSFET power transistors M11–M14 interconnected with each other and to a pair of load terminals 302 and 304. H-bridge 300 is configured to apply a high-voltage level and ground potential (e.g., 100 volts and zero volts) across an inductive load 310. The applied voltages alternate between terminals 302 and 304 so that the current through load 310 periodically reverses direction. Transistors M11–M14 are connected through conventional drivers 320 to a conventional switching servo amplifier (not shown). In one embodiment, driver circuits 320 are conventional MOSFET drivers available from Harris Semiconductor of Melbourne, Fla. as part number HIP2500IP.

Each of transistors M11-M14 has a corresponding voltage-clamp diode VC1–VC4 connected, in a reverse-current direction, from source to drain. Transistors M12 and M14 have respective transient-voltage suppressers TVS2 and TVS4 that, like voltage-clamp diodes VC2 and VC4, are connected in a reverse-current direction from source to drain.

Figure 1:
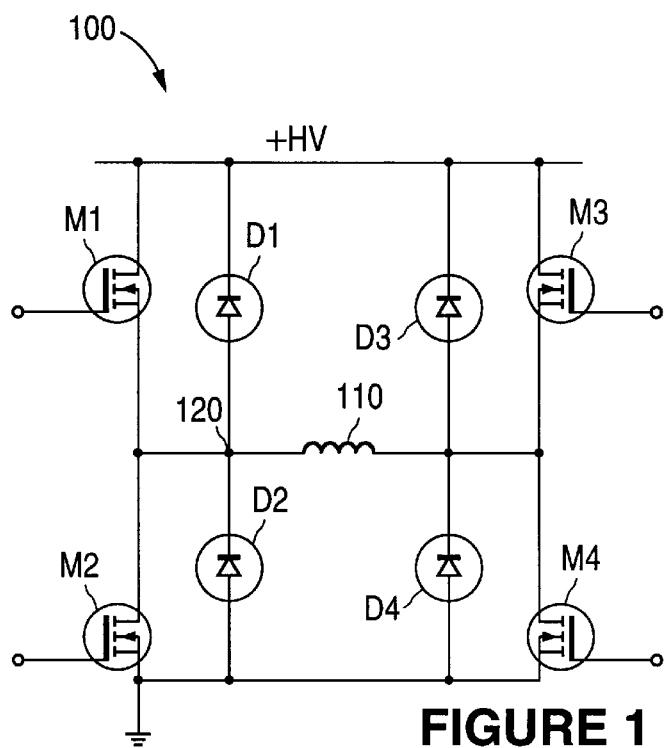
FIG. 1 depicts a conventional H-bridge 100.

Voltage-clamp diodes VC1–VC4 and transient-voltage suppressers TVS2 and TVS4 are selected to minimize the noise described above in connection with FIGS. 1 and 2. Transient-voltage suppressers TVS2 and TVS4 are selected for their fast response time. In one embodiment, TVS2 and TVS4 are available from General Instruments as part number 1.5KE100A. Those transient-voltage suppressers have a response time of approximately one picosecond, a minimum breakdown voltage of 95 volts, and a maximum breakdown voltage of 103 volts.

Voltage-clamp diodes VC1–VC4 respond much more slowly than do transient-voltage suppressers TVS2 and TVS4; however, diodes VC1–VC4 offer far greater voltage-clamping precision. In one embodiment, voltage-clamp diodes VC1–VC4 are available from Motorola of Phoenix, Ariz. as part number MURS320T3. Those voltage-clamp diodes have a response time of approximately fifteen to thirty-five nanoseconds and a clamping voltage of one diode drop above or below a reference H-bridge circuits in accordance with the present invention take advantage of the best characteristics and transient-voltage suppressers TVS2 and TVS4 and voltage-clamp diodes VC1–VC4 to minimize the noise associated with the inductive kick exhibited by load 310 during switching. Transistors M11 and M13 may have respective transient-voltage suppressers TVS1 and TVS3 connected in a reverse-current direction from source to drain to further reduce noise; however, some embodiments of the invention do not include transient-voltage suppressers TVS1 and TVS3.

Figure 2:
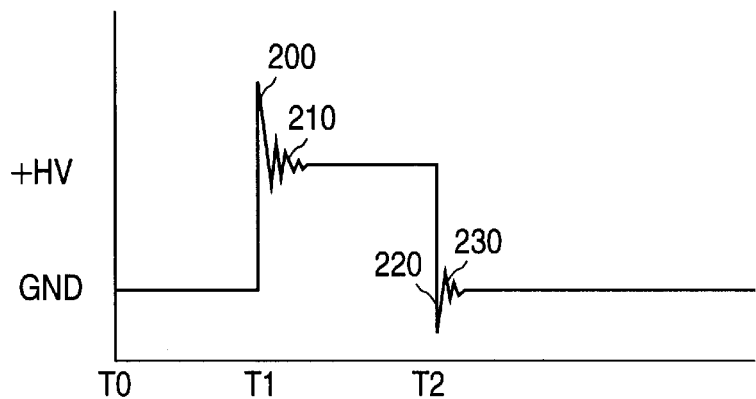
FIG. 2 shows a voltage signal exhibiting a ringing due to the inductive kick of a load.
Figure 4:
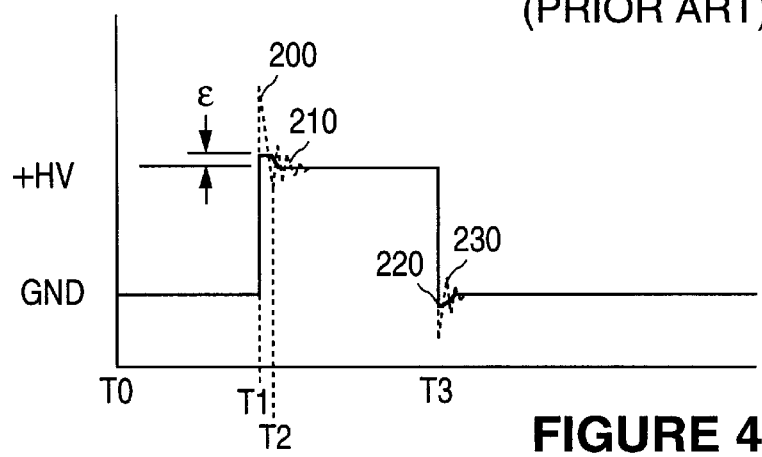
FIG. 4 depicts the voltage signal on one terminal of an inductive load 310 (solid line) superimposed on a relatively noisy prior-art voltage signal (dashed line)

FIG. 4 depicts the voltage signal on terminal 302 of load 310 (solid line) superimposed on the prior-art voltage signal (dashed line) that includes spikes 200/230 and ringing 210/220 as discussed in connection with FIG. 2. From time T0 to T1 transistors M12 and M13 are switched on and transistors M11 and M14 off. Terminal 302 is therefore pulled to ground and current flows from a high-voltage terminal +HV to ground via transistor M13, load 310, and transistor M12. Next, at time T1, transistors M12 and M13 are switched off and transistors M11 and M14 switched on. The voltage on terminal 302 rises above the level of the high-voltage terminal +HV due to the inductive kick from load 310; however, transient-voltage suppresser TVS2 conducts at a voltage level only slightly above the level of high-voltage terminal +HV, and thereby reduces or eliminates noise spike 200. The fast response time of TVS2 is necessary to suppress noise spike 200 because noise spike 200 occurs instantaneously.

From time T1 to time T2, approximately fifteen to thirty-five nanoseconds, TVS2 controls the voltage on node 330 to a level slightly above the voltage level on the high-voltage terminal +HV. The voltage on node 302 will vary from the voltage level on high-voltage terminal +HV by some error ξ due to the clamping-voltage error of TVS2. Voltage-clamp diode VC1 is slower to respond but more accurate than is TVS2. Hence, at time T2 voltage-clamp diode VC1 clamps the voltage on node 302 to a level approximately one diode drop above the level on terminal +HV. The voltage on node 302 then settles to the level on terminal +HV after the excess energy from the inductive kick is fully absorbed. The voltage on terminal 302 then remains at approximately the level of terminal +HV until time T3, at which time transistors M12 and M13 are switched back on and transistors M11 and M14 switched off.

Figure 5:
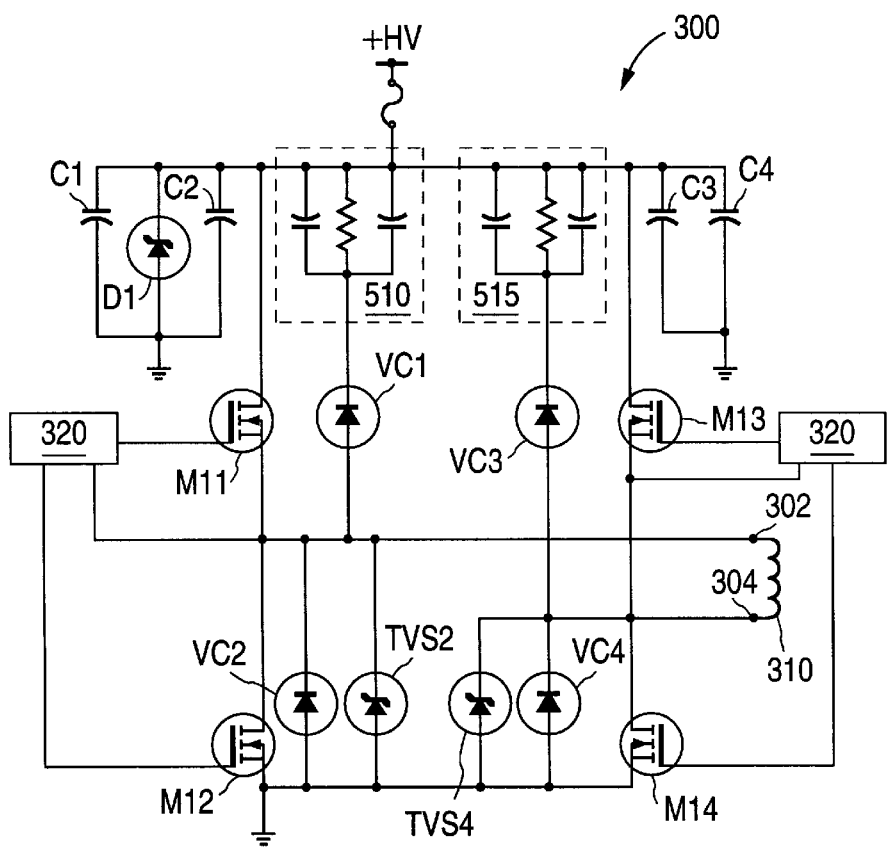
FIG. 5 is a detailed schematic diagram of H-bridge circuit 300.

FIG. 5 is a detailed schematic diagram of an H-bridge 300 and associated drive circuitry configured in accordance with the present invention. H-bridge 300 is shown in FIG. 5 without transient-voltage suppressers TVS1 and TVS3 in accordance with one embodiment of the present invention. H-bridge 300 includes a pair of tank circuits 510 and 515 that absorb and dissipate energy from noise spikes. Similar circuits may be used for the ground side of H-bridge 300; however such circuits are typically not as necessary on the ground side because the ground terminal is designed to be of low impedance. Providing low impedance to ground is within the ordinary skill in the art.

Transistors M11 through M14 are selected to handle very high current. In an embodiment that requires transistors M11 through M14 to conduct two amps, for example, transistors M11 through M14 are rated to forward conduct 28 amps to avoid a large voltage drop across the transistors. This selection of transistors has been found to improve the noise characteristics of H-bridge 300 by reducing the source-to-drain voltage drop across transistors M11 through M14. Suitable transistors are available from International Rectifier Corporation of El Segundo, Calif. as part number IRF540. A diode D1 and capacitors C1–C4 protect H-bridge 300 from potentially damaging voltage spikes and filter noise to and from the +HV power source.

While the present invention has been described in connection with specific embodiments, variations of these embodiments will be obvious to those of ordinary skill in the art. For example, conventional half-bridge amplifiers or multiple-phase amplifiers can be modified in accordance with the present invention for improved performance, or bipolar or other types of switches may be used. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

What is claimed is:

1. An amplifier for driving a load, the amplifier comprising:

first and second input nodes;

a first transistor having a control terminal connected to the first input node, a first current-handling terminal connected to a first voltage potential, and a second current-handling terminal connected to the load;

a second transistor having a control terminal connected to the second input node, a first current-handling terminal connected to the load, and a second current-handling terminal connected to a second voltage potential;

a voltage clamp connected between the first and second current-handling terminals of the first transistor, the voltage clamp having a voltage clamp response time; and a transient-voltage suppresser connected between the first and second current-handling terminals of the second transistor, the transient-voltage suppresser having a transient-voltage suppresser response time that is smaller than the voltage clamp response time.

2. The amplifier of claim 1, further comprising a second voltage clamp connected between the first and second terminals of the second transistor.

3. The amplifier of claim 1, further comprising a second transient-voltage suppresser connected between the first and second terminals of the first transistor.

4. The amplifier of claim 1, wherein the load comprises an inductance.

5. The amplifier of claim 1, wherein the transistors are power MOSFET transistors.

6. The amplifier of claim 1, further comprising:
 a third transistor having a control terminal connected to a third input node, a first current-handling terminal connected to the first voltage potential, and a second current-handing terminal connected to the load; and
 a fourth transistor having a control terminal connected to a fourth input node, a first current-handling terminal connected to the load, and a second current-handing terminal connected to the second voltage potential.

7. The amplifier of claim 6, further comprising:
 a second voltage clamp connected between the first and second current-handling terminals of the third transistor; and
 a second transient-voltage suppresser connected between the first and second current-handling terminals of the fourth transistor.

8. The amplifier of claim 7, wherein the second voltage clamp and second transient-voltage suppresser have respective response times, and wherein the second-voltage-clamp response time is greater than the second-transient-voltage-suppresser response time.

9. The amplifier of claim 7, further comprising a third voltage clamp connected between the first and second terminals of the fourth transistor.

10. The amplifier of claim 7, further comprising a third transient-voltage suppresser connected between the first and second terminals of the third transistor.

11. An amplifier for driving a load, the amplifier comprising:
 first and second input nodes;
 a first transistor having a control terminal connected to the first input node, a first current-handling terminal connected to a first voltage potential, and a second current-handing terminal connected to the load;
 a second transistor having a control terminal connected to the second input node, a first current-handling terminal connected to the load, and a second current-handing terminal connected to a second voltage potential;
 first noise-suppression means connected between the first and second current-handling terminals of the first transistor, the noise-suppression means having a first response time; and
 second noise-suppression means connected between the first and second current-handling terminals of the second transistor, the second noise-suppression means having a second response time smaller than the first response time.

12. The amplifier of claim 11, wherein the load comprises an inductance.

13. The amplifier of claim 11, wherein the transistors are MOSFET transistors.

14. The amplifier of claim 11, further comprising:
 a third transistor having a control terminal connected to a third input node, a first current-handling terminal connected to the first voltage potential, and a second current-handling terminal connected to the load; and
 a fourth transistor having a control terminal connected to a fourth input node, a first current-handling terminal connected to the load, and a second current-handing terminal connected to the second voltage potential.

15. The amplifier of claim 14, further comprising:
 a third noise-suppression means connected between the first and second current-handling terminals of the third transistor; and
 a fourth noise-suppression means connected between the first and second current-handling terminals of the fourth transistor.

16. The amplifier of claim 15, wherein the third noise-suppression means has a third response time and the fourth noise-suppression means has a fourth response time, and wherein the third response time is greater than the fourth response time.

* * * * *